(12) United States Patent
Hirasawa et al.

(10) Patent No.: US 8,022,600 B2
(45) Date of Patent: Sep. 20, 2011

(54) PIEZOELECTRIC POWER GENERATING MECHANISM WITH SPRING MATERIAL

(75) Inventors: Taku Hirasawa, Kyoto (JP); Jyunpei Matsuzaki, Osaka (JP)

(73) Assignee: Panasonic Corporation, Osaka (JP)

( * ) Notice: Subject to any disclaimer, the term of this patent is extended or adjusted under 35 U.S.C. 154(b) by 242 days.

(21) Appl. No.: 12/374,598

(22) PCT Filed: Oct. 29, 2007

(86) PCT No.: PCT/JP2007/071025
§ 371 (c)(1),
(2), (4) Date: Jan. 21, 2009

(87) PCT Pub. No.: WO2008/053835
PCT Pub. Date: May 8, 2008

(65) Prior Publication Data
US 2010/0013357 A1    Jan. 21, 2010

(30) Foreign Application Priority Data

Nov. 1, 2006   (JP) .................................. 2006-297832

(51) Int. Cl.
*H01L 41/08*    (2006.01)
*H03H 9/19*    (2006.01)
(52) U.S. Cl. ........ 310/339; 310/329; 310/330; 310/331; 310/332
(58) Field of Classification Search .................. 310/339, 310/329–332
See application file for complete search history.

(56) References Cited

U.S. PATENT DOCUMENTS

| | | | | |
|---|---|---|---|---|
| 3,739,202 A | * | 6/1973 | Cady | 310/329 |
| 5,635,642 A | * | 6/1997 | Nonomura et al. | 73/504.16 |
| 7,057,330 B2 | * | 6/2006 | Buhler et al. | 310/339 |
| 7,626,316 B2 | * | 12/2009 | Kozinsky et al. | 310/339 |
| 7,667,375 B2 | * | 2/2010 | Berkcan et al. | 310/339 |
| 7,696,673 B1 | * | 4/2010 | Yavid | 310/339 |
| 2008/0277941 A1 | * | 11/2008 | Bowles et al. | 310/339 |
| 2009/0211353 A1 | * | 8/2009 | Gao et al. | 310/339 |
| 2010/0270889 A1 | * | 10/2010 | Xu et al. | 310/339 |

FOREIGN PATENT DOCUMENTS

| | | | | |
|---|---|---|---|---|
| JP | 01059006 | A | * | 3/1989 |
| JP | 01084113 | A | * | 3/1989 |
| JP | 07092017 | A | * | 4/1995 |
| JP | 2003-218418 | | | 7/2003 |
| JP | 2005-45988 | | | 2/2005 |
| JP | 2005-57982 | | | 3/2005 |
| JP | 2006-158112 | | | 6/2006 |

* cited by examiner

*Primary Examiner* — Jaydi San Martin
(74) *Attorney, Agent, or Firm* — Hamre, Schumann, Mueller & Larson, P.C.

(57) ABSTRACT

Oscillators (101a and 101b) are attached to a spring material (100) whose both ends (105a and 105b) are held, and piezoelectric elements (103a, 103b, and 106) are attached to the spring material or the oscillators. Assuming that an axis parallel to an axis connecting the both ends of the spring material is a Y-axis, an axis parallel to a plane including the Y-axis and the oscillators and orthogonal to the Y-axis is an X-axis, and an axis orthogonal to the Y-axis and the X-axis is a Z-axis, the oscillators are asymmetric with respect to a plane including the Y-axis and the Z-axis. Consequently, when acceleration is applied, torsional vibrations act on the spring material. When the torsional rigidity of the spring material is set to be low, the resonant frequency of the torsional vibrations can be reduced. Since the both ends of the spring material are held, the spring material is bent in a small amount. Therefore, it is possible to realize a downsized piezoelectric power generating mechanism with a low resonant frequency.

7 Claims, 11 Drawing Sheets

PIEZOELECTRIC POWER GENERATING MECHANISM WITH SPRING MATERIAL

TECHNICAL FIELD

The present invention relates to a piezoelectric power generating mechanism that obtains electric power from mechanical vibration energy. In particular, the present invention relates to a piezoelectric power generating mechanism that converts energy of low frequency vibrations generated by movements of large-scale structures such as a high-rise building and a bridge, body movements, or the like into electric power with a piezoelectric element, thereby generating electricity.

BACKGROUND ART

When sensors located at a number of points are connected to each other via a network, information obtained from the respective sensors can serve for control and security of an information device and monitoring of an environment. For example, large-scale structures such as a high-rise building and a bridge are required to have a life of several decades. The repair of such structures before being damaged, rather than after being damaged seriously, can be done at lower cost with a higher degree of safety. In view of this, it is considered to install an acceleration sensor or a strain sensor in such a structure so as to perform long-term monitoring, thereby predicting damage to be caused thereto and the like. Also, it is considered to attach a sensor to person's clothing, belongings, or appliances so as to record its position, temperature, and the like, thereby managing goods, predicting person's behavior, performing environmental measurement, and the like.

When long-term observations are performed using a sensor as described above, a conventional battery or cell does not serve practically as a power source for the sensor because it provides only a short operation period and costs more for replacement.

When the sensor is operated intermittently, the operation can continue for a long term with several µW of electric power. As a method for obtaining such electric power, there is a method of collecting vibration energy in an environment where the sensor is attached as electric energy.

As a power generating mechanism that collects vibration energy as electric energy, a power generating mechanism using a piezoelectric material as described in Patent Document 1 is known. When a piezoelectric material is strained, an electric charge is generated in the polarization direction, resulting in the generation of an electric field. With the use of such a material, mechanical vibration energy can be converted into electric energy. Patent Document 1 discloses a power generating mechanism in which one end of a piezoelectric material shaped into a strip is fixed, and a mass is attached to the other end thereof, so that the piezoelectric material is bent and deformed due to external vibrations, thereby generating electricity.

In order to generate electricity efficiently with such a vibration-type power generating mechanism, it is required that the oscillation frequency of vibration energy to be collected and the resonant frequency of the power generating mechanism be approximated to each other. More specifically, it is necessary to analyze vibrations to be collected as electric energy, so that the resonant frequency of the power generating mechanism is set in accordance with the analysis.

For example, FIG. 15A shows a change with time in acceleration caused when a human is walking, and FIG. 15B shows frequency components of acceleration caused when a human is walking. As shown in FIG. 15B, vibrations generated when a human is walking include a large number of low frequency components of not more than several Hz. Thus, in order to generate electricity by body movements of a human while he/she is walking, it is necessary to use a power generating mechanism with a resonant frequency as low as the above.

Further, structures such as a building and a bridge also are vibrated due to the wind or a movable body passing in the vicinity thereof. Since a structure itself is large in size, its oscillation frequency is known to be as low as approximately several Hz. Thus, a power generating mechanism with a low resonant frequency is required also in the case of collecting electric energy from vibrations of a structure.

Meanwhile, when a power generating mechanism is large in size, the place where a sensor including the power generating mechanism is to be attached is limited. For this reason, a power generating mechanism is preferably as small in size as possible.

Patent Document 1: JP 2005-45988 A

DISCLOSURE OF INVENTION

Problem to be Solved by the Invention

However, when the resonant frequency of a power generating mechanism is reduced in accordance with the oscillation frequency of vibration energy to be collected, bending due to gravity and input vibrations becomes larger, which brings about the necessity of ensuring a large vibration space for a mass. Consequently, there is a problem that it is impossible to reduce both the resonant frequency of a power generating mechanism and the size thereof at the same time.

As shown in FIG. 16A, a conventional vibration-type power generating mechanism is a cantilevered vibrating structure in which one end 500 of a strip beam 501 is fixed, and a mass 502 is attached to the other end thereof. When the beam 501 is regarded as a spring, this structure can be modeled as a vibration system in which a mass m is hung on a lower end of a spring having a spring constant k as shown in FIG. 16B. In FIG. 16A, reference numeral 503 denotes a piezoelectric element attached to the beam to be bent and deformed. This vibration system has a resonant frequency f expressed by Formula (1).

[Formula 1]

$$f = \frac{1}{2\pi}\sqrt{\frac{k}{m}} \quad (1)$$

When a restoring force of the beam 501 and the gravity of the mass 502 are balanced, the relationship of Formula (2) is satisfied, where δ is a displacement amount (bending) of the mass 502 due to gravity.

[Formula 2]

$$k\delta = mg \quad (2)$$

When the resonant frequency f of the vibration system is set to be a certain value, the ratio (k/m) of the spring constant k to the mass m is determined by Formula (1). When the ratio (k/m) of the spring constant k to the mass m is determined, the displacement amount δ of the mass 502 due to gravity is determined by Formula (2). According to Formula (1) and Formula (2), when the resonant frequency f of the vibration system is reduced, the displacement amount δ becomes larger. When vibrations with an oscillation frequency equal or close to the resonant frequency f are applied to the vibration system, the mass 502 starts being vibrated from a state where it is displaced by the displacement amount δ due to gravity. Thus, in the vibration-type power generating mechanism that causes bending and deformation as shown in FIG. 16A, when it is attempted to reduce the resonant frequency f in accordance with a low oscillation frequency of an ambient environment for efficient power generation, the displacement amount δ of the mass 502 due to gravity is increased, and the amplitude of the mass 502 becomes larger due to the oscillation frequency approximated to the resonant frequency f, which results in difficulty in downsizing the power generating mechanism. Namely, in the conventional vibration-type power generating mechanism, it is impossible to reduce both the resonant frequency f and the size at the same time.

For example, in a vibration system with a resonant frequency of 8 Hz, the mass 502 is displaced by about 3 mm due to gravity in a static state regardless of the length of the beam 501 according to Formula (1) and Formula (2). When external vibrations with an oscillation frequency close to the resonant frequency are applied to this vibration system, the mass 502 is vibrated greatly from the static state. Thus, it is necessary to ensure a space required by the vibration amplitude of the mass 502 due to the external vibrations in addition to the displacement amount δ of the mass 502 in the static state. As a result, it is impossible to realize a vibration-type power generating mechanism whose size in the displacement direction (amplitude direction) of the mass 502 is 3 mm or less.

Meanwhile, when a power generating mechanism is applied to a microdevice, it is necessary to make members such as a beam smaller, which makes it difficult to achieve a low resonant frequency.

The present invention is to solve the conventional problems as described above, and it is an object thereof to realize a piezoelectric power generating mechanism that has a low resonant frequency and is downsized by reducing a bending amount due to gravity and acceleration.

Means for Solving Problem

A piezoelectric power generating mechanism according to the present invention includes: a spring material whose both ends are held; at least one oscillator attached to the spring material; and a piezoelectric element attached to the spring material or the at least one oscillator. Assuming that an axis parallel to an axis connecting the both ends of the spring material is a Y-axis, an axis parallel to a plane including the Y-axis and the at least one oscillator and orthogonal to the Y-axis is an X-axis, and an axis orthogonal to the Y-axis and the X-axis is a Z-axis, the at least one oscillator is asymmetric with respect to a plane including the Y-axis and the Z-axis.

Effects of the Invention

According to the present invention, since the at least one oscillator is asymmetric with respect to a plane including the Y-axis and the Z-axis, when acceleration is applied to the piezoelectric power generating mechanism, a rotation moment is exerted on the spring material, and torsional vibrations act on the spring material. The torsional vibrations correspond to a vibration mode of the lowest order. The resonant frequency of the torsional vibrations depends on a moment of inertia with respect to the spring material as an axis and the torsional rigidity of the spring material. Thus, when the torsional rigidity of the spring material is set to be low, the resonant frequency of the torsional vibrations can be reduced.

Meanwhile, since the both ends of the spring material for supporting the mass of the oscillator are fixed, a tension exerted on the spring material suppresses a bending amount of the spring material due to gravity and acceleration. Thus, the oscillator is displaced by a small amount when the spring material is bent.

As described above, according to the present invention, the configuration for reducing the resonant frequency and the configuration for supporting the mass of the oscillator are provided separately. Therefore, it is possible to achieve a reduction in the resonant frequency and the downsizing of the device by making a vibration space smaller at the same time.

DESCRIPTION OF THE INVENTION

In the above-described piezoelectric power generating mechanism of the present invention, preferably, a plurality of the oscillators are provided, and the plurality of the oscillators are attached to the spring material at different positions in a Y-axis direction. Consequently, torsional deformation of the spring material becomes larger, resulting in a higher power generation voltage at the spring material.

Preferably, the oscillator includes a mass portion and a beam portion having spring characteristics, and one end of the beam portion is connected to the spring material, and the other end thereof is connected to the mass portion. Consequently, the device can be reduced in size with its resonant frequency kept low.

Preferably, a plurality of the oscillators are provided, and the mass portions of the plurality of the oscillators have masses different from each other. Consequently, when acceleration is applied, rotation moments exerted on the spring material by the plurality of the oscillators respectively can be made different from each other, resulting in torsional vibrations acting on the spring material efficiently.

Preferably, a plurality of the oscillators are provided, and the beam portions of the plurality of the oscillators have shapes different from each other. Consequently, when acceleration is applied, rotation moments exerted on the spring material by the plurality of the oscillators respectively can be made different from each other virtually without increasing the mass of the whole device, resulting in torsional vibrations acting on the spring material efficiently.

Preferably, the piezoelectric element is attached to the spring material. Consequently, mechanical deformation of the spring material accompanying torsional vibrations of the spring material can be converted into electric energy, resulting in a smaller loss of energy.

Preferably, the piezoelectric element is attached to the beam portion. Consequently, flexural deformation of the beam portion can be converted into electric energy, thereby obtaining electric power efficiently.

Hereinafter, preferred embodiments of the present invention will be described with reference to the drawings.

Embodiment 1

Figure 1:
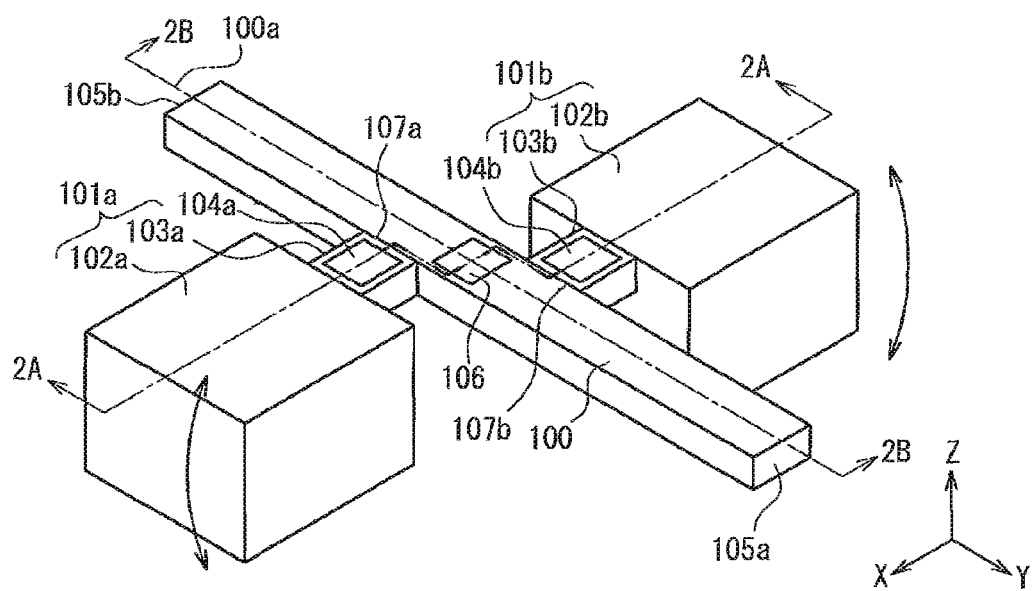
FIG. 1 is a perspective view showing a schematic configuration of a piezoelectric power generating mechanism according to Embodiment 1 of the present invention.
Figure 2A:
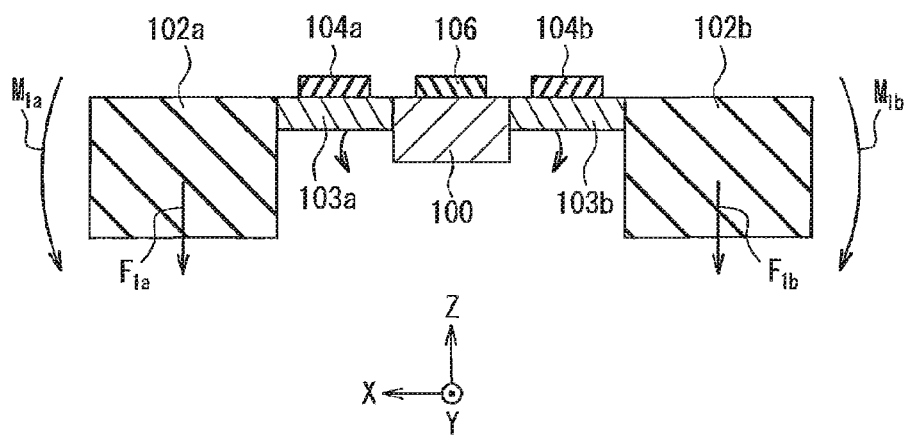
FIG. 2A is a combined cross-sectional view of the piezoelectric power generating mechanism according to Embodiment 1 of the present invention as shown in FIG. 1, showing a cross section cut stepwise along alternate long and short dashed lines 2A-2A and seen from an arrow direction.
Figure 2B:
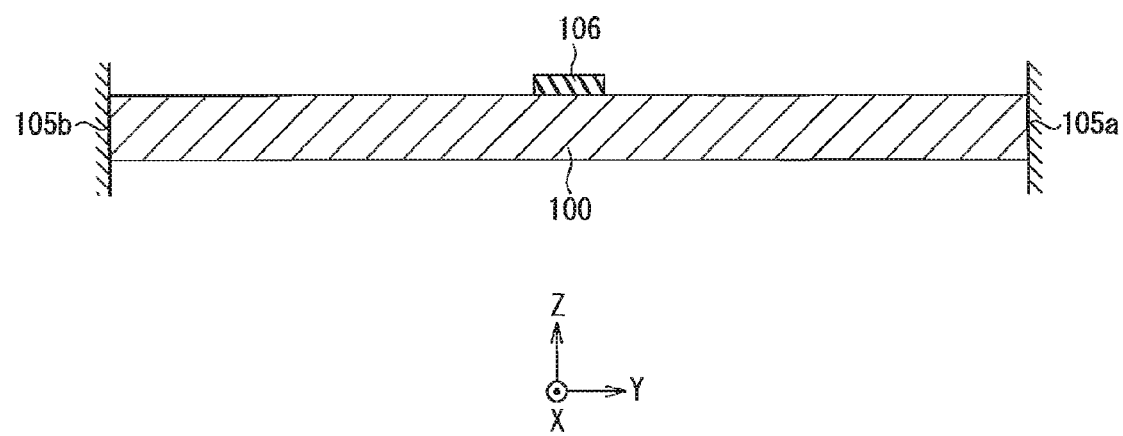
FIG. 2B is a cross-sectional view of a spring material constituting the piezoelectric power generating mechanism according to Embodiment 1 of the present invention as shown in FIG. 1, showing a cross section cut along alternate long and short dashed lines 2B-2B and seen from an arrow direction.

FIG. 1 is a perspective view showing a schematic configuration of a piezoelectric power generating mechanism according to Embodiment 1 of the present invention. FIG. 2A is a combined cross-sectional view of the piezoelectric power generating mechanism according to Embodiment 1, showing a cross section cut stepwise along alternate long and short dashed lines 2A-2A in FIG. 1 and seen from an arrow direction. FIG. 2B is a cross-sectional view of a spring material constituting the piezoelectric power generating mechanism according to Embodiment 1 of the present invention as shown in FIG. 1, showing a cross section cut along alternate long and short dashed lines 2B-2B and seen from an arrow direction. In FIG. 2B, for simplicity of the figure, an oscillator seen behind the cross section is not shown.

The piezoelectric power generating mechanism of Embodiment 1 is characterized in that positions at which a plurality of oscillators are attached to a spring material are different in the longitudinal direction of the spring material. The piezoelectric power generating mechanism includes a spring material 100, two oscillators 101a and 101b attached to the spring material 100, and piezoelectric elements 104a, 104b, and 106 for converting vibration energy into electric energy. Both ends 105a and 105b of the spring material 100 are fixed. For convenience of explanation, as shown in the figure, an XYZ rectangular coordinate system is set, in which an axis parallel to a major axis of the spring material 100, i.e., an axis 100a connecting the both ends 105a and 105b of the spring material 100, is a Y-axis, an axis parallel to a plane including the Y-axis and the two oscillators 101a and 101b and orthogonal to the Y-axis is an X-axis, and an axis orthogonal to the Y-axis and the X-axis is a Z-axis.

The oscillators 101a and 101b respectively include mass portions 102a and 102b, and beam portions 103a and 103b having spring characteristics. One end of each of the beam portions 103a and 103b is connected to the spring material 100, and the other end thereof is connected to each of the mass portions 102a and 102b. The positions of the oscillator 101a and the oscillator 101b in the Z-axis direction are the same. The piezoelectric elements 104a and 104b are attached to the beam portions 103a and 103b, respectively, and the piezoelectric element 106 is attached to the spring material 100.

The oscillator 101a and the oscillator 101b are identical in specifications, and the piezoelectric element 104a and the piezoelectric element 104b are identical in specifications. However, a position 107a at which the oscillator 101a is attached to the spring material 100 and a position 107b at which the oscillator 101b is attached to the spring material 100 are different from each other in the axis 100a direction (Y-axis direction). In other words, the oscillator 101a and the oscillator 101b are arranged on both sides with respect to a plane including the Y-axis and the Z-axis (hereinafter, referred to as a "YZ plane"), and are asymmetric with respect to the YZ plane.

The piezoelectric power generating mechanism of Embodiment 1 is placed so that the direction of acceleration caused when a structure is vibrated, a human is walking, or the like coincides with the Z-axis direction. When acceleration in the positive direction of the Z-axis acts on the piezoelectric power generating mechanism, the mass portions $102a$ and $102b$ are subjected to inertial forces $F_{1a}$ and $F_{1b}$, respectively, in the negative direction of the Z-axis as shown in FIG. 2A. Since the mass portions and the beam portions of the oscillator $101a$ and the oscillator $102b$ are set to be identical in specifications such as a mass and a shape, the inertial force $F_{1a}$ and the inertial force $F_{1b}$ are equal, and accordingly rotation moments $M_{1a}$ and $M_{1b}$ equal in magnitude and opposite in direction are exerted on the spring material 100 with the axis $100a$ as a center.

Since the attachment position $107a$ of the oscillator $101a$ and the attachment position $107b$ of the oscillator $101b$ are different in the axis $100a$ direction, the spring material 100 is twisted between the attachment position $107a$ and the attachment position $107b$, between the attachment position $107a$ and the end $105b$, and between the attachment position $107b$ and the end $105a$, and a restoring force thereof causes vibrations. Energy of the vibrations is converted into electric energy by the piezoelectric elements $104a$, $104b$, and $106$. The power generating mechanism of Embodiment 1 is based on the above-described principle of power generation.

In the present embodiment, since the both ends $105a$ and $105b$ of the spring material 100 are fixed, the masses of the oscillators $101a$ and $101b$ are held by a tension exerted on the spring material 100. Thus, the mass portions $102a$ and $102b$ are displaced by a small amount when the spring material 100 is bent due to gravity and acceleration. Meanwhile, when the torsional rigidity of the spring material 100 is set to be low, the resonant frequency of torsional vibrations can be reduced significantly. Therefore, it is possible to realize a downsized piezoelectric power generating mechanism with a low resonant frequency.

In FIGS. 1 and 2A, the beam portions $103a$ and $103b$ have a rectangular parallelepiped shape. However, the shape of the beam portions $103a$ and $103b$ is not limited thereto as long as they can hold the mass portions $102a$ and $102b$.

In FIGS. 1, 2A, and 2B, the spring material 100 is a platelike member whose cross section taken in a direction vertical to the axis $100a$ is a certain rectangle. However, the shape of the spring material 100 is not limited particularly, and the same effect as described above can be achieved as long as the masses of the oscillators $101a$ and $101b$ can be held by a tension exerted on the spring material 100 with a small bending amount in a state where it is held at the both ends $105a$ and $105b$, and the torsional rigidity of the spring material 100 itself is low.

In the present embodiment, the attachment positions of the piezoelectric elements are not limited to those shown in FIGS. 1 and 2A. For example, the piezoelectric element may be attached to only either one of the spring material 100 and the beam portions $103a$ and $103b$.

When the piezoelectric element is attached to the spring material 100, the attachment position is not limited to a region between the attachment position $107a$ and the attachment position $107b$ as shown in FIG. 1. The piezoelectric element may be attached to a region between the attachment position $107a$ and the end $105b$ and/or a region between the attachment position $107b$ and the end $105a$. The piezoelectric element attached in any of these regions also can be distorted due to a twist of the spring material 100, making it possible to obtain electric power.

Further, the piezoelectric elements may be attached to both sides of the spring material 100 and/or the beam portions $103a$ and $103b$ so as to form a bimorph structure, instead of being attached to only one side of the spring material 100 and the beam portions $103a$ and $103b$ as shown in FIGS. 1 and 2A.

Furthermore, when a plurality of the piezoelectric elements are attached at different positions in consideration of deformation of the members due to vibrations, and are connected so that electric power generated by the respective piezoelectric elements is not cancelled each other, a larger amount of electric power can be obtained.

Example 1

The piezoelectric power generating mechanism of Embodiment 1 was produced with the use of thin film formation by sputtering and photolithography. A production method will be described schematically below.

Figure 3A:
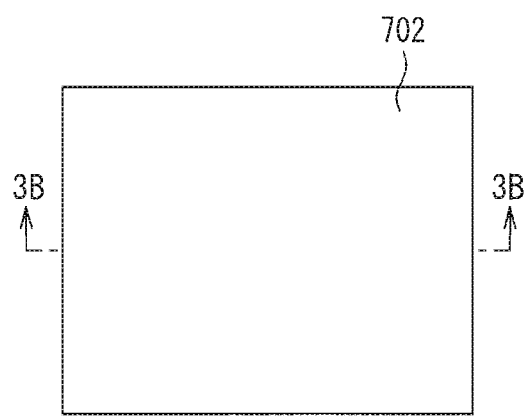
FIG. 3A is a plan view showing one step of manufacturing the piezoelectric power generating mechanism according to Embodiment 1 of the present invention.
Figure 3B:
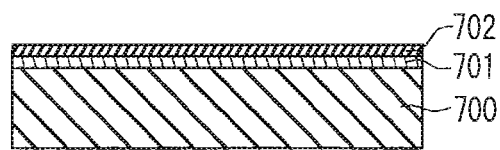
FIG. 3B is a cross-sectional view showing a cross section cut along alternate long and short dashed lines 3B-3B in FIG. 3A and seen from an arrow direction.

Initially, as shown in FIGS. 3A and 3B, an electrode layer 701 of Pt with a thickness of 0.1 μm was formed by sputtering on a silicon substrate 700 with a thickness of 400 μm, and a PZT thin film with a thickness of 3 μm further was formed thereon as a piezoelectric substance 702.

Figure 4A:
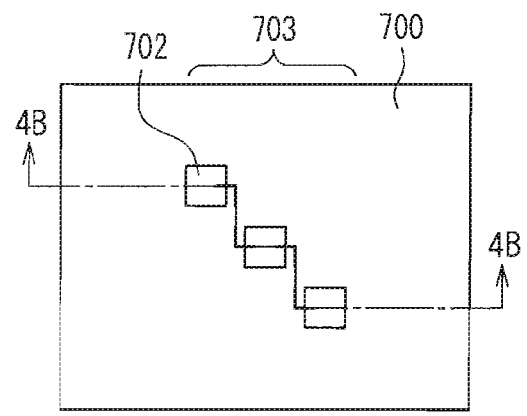
FIG. 4A is a plan view showing one step of manufacturing the piezoelectric power generating mechanism according to Embodiment 1 of the present invention.
Figure 4B:
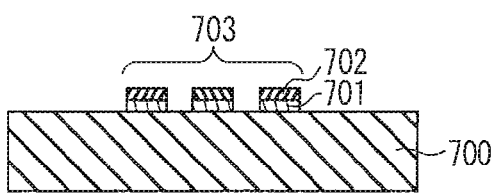
FIG. 4B is a combined cross-sectional view showing a cross section cut stepwise along alternate long and short dashed lines 4B-4B in FIG. 4A and seen from an arrow direction.

Then, as shown in FIGS. 4A and 4B, a pattern was formed on the piezoelectric substance 702 with a resist, and the piezoelectric substance 702 and the electrode layer 701 in a region where the resist was not formed were etched, so that only a portion 703 to serve as a piezoelectric element was left.

Figure 5A:
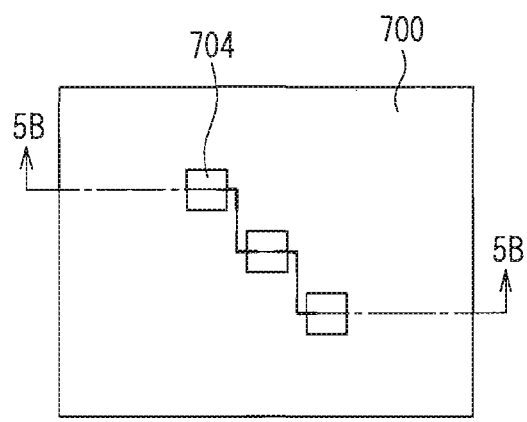
FIG. 5A is a plan view showing one step of manufacturing the piezoelectric power generating mechanism according to Embodiment 1 of the present invention.
Figure 5B:
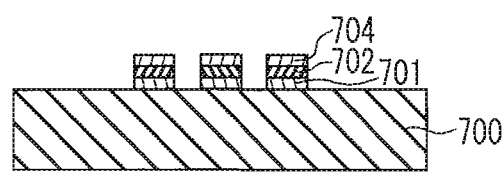
FIG. 5B is a combined cross-sectional view showing a cross section cut stepwise along alternate long and short dashed lines 5B-5B in FIG. 5A and seen from an arrow direction.

Then, as shown in FIGS. 5A and 5B, an electrode 704 of Pt with a thickness of 0.1 μm was formed only on the patterned piezoelectric substance 702.

Figure 6A:
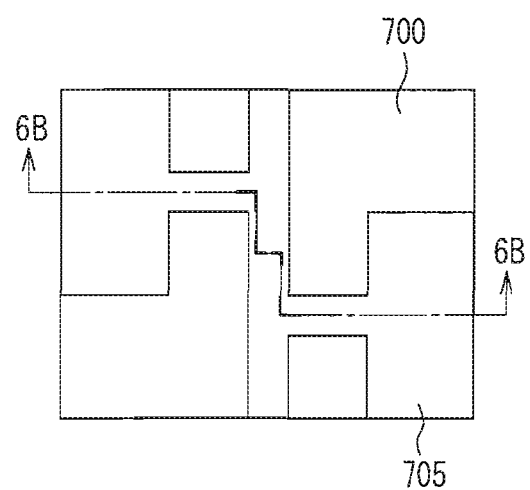
FIG. 6A is a plan view showing one step of manufacturing the piezoelectric power generating mechanism according to Embodiment 1 of the present invention.
Figure 6B:
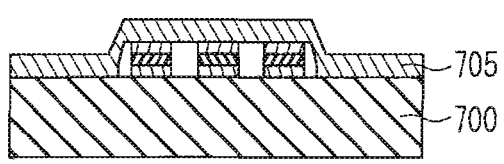
FIG. 6B is a combined cross-sectional view showing a cross section cut stepwise along alternate long and short dashed lines 6B-6B in FIG. 6A and seen from an arrow direction.

After that, as shown in FIGS. 6A and 6B, polyimide 705 with a thickness of 5 μm that was patterned into a planar shape of a spring material and oscillators was formed.

Figure 7A:
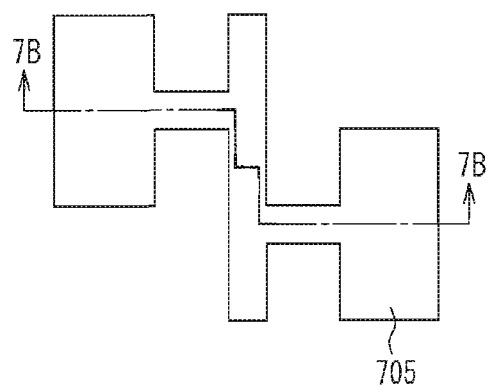
FIG. 7A is a plan view showing one step of manufacturing the piezoelectric power generating mechanism according to Embodiment 1 of the present invention.
Figure 7B:
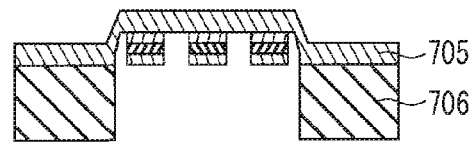
FIG. 7B is a combined cross-sectional view showing a cross section cut stepwise along alternate long and short dashed lines 7B-7B in FIG. 7A and seen from an arrow direction.

Finally, as shown in FIGS. 7A and 7B, the silicon substrate 700 was dry-etched from its back side using a mixed gas of $SF_6$ and $O_2$, except for a portion 706 to serve as a mass portion.

The piezoelectric power generating mechanism produced in this manner included a spring material made of polyimide with a length (dimension in the Y-axis direction) of 3000 μm, a width (dimension in the X-axis direction) of 100 μm, and a thickness (dimension in the Z-axis direction) of 5 μm, a pair of mass portions, each made of a silicon substrate with a height (dimension in the Y-axis direction) of 1800 μm, a width (dimension in the X-axis direction) of 1250 μm, and a thickness (dimension in the Z-axis direction) of 400 μm, a pair of beam portions for supporting the pair of mass portions, each made of polyimide with a length (dimension in the X-axis direction) of 100 μm, a width (dimension in the Y-axis direction) of 300 μm, and a thickness (dimension in the Z-axis direction) of 5 μm, and piezoelectric elements attached to the pair of beam portions and the spring material, each having a thickness (dimension in the Z-axis direction) of 3 μm.

The power generation characteristics of this piezoelectric power generating mechanism were predicted by using a finite element method. A primary resonant frequency was 8 Hz, and kinetic energy of the mass portions at the time of resonance was 1.6 μJ/s. Assuming that the efficiency of converting kinetic energy into electric energy was 10%, it was found that this power generating mechanism was expected to generate electricity of 0.16 μW.

In order to form a piezoelectric substance thin film with excellent characteristics, a high-temperature treatment at a temperature between 600° C. and 700° C. is required. For this reason, the piezoelectric substance 702 was formed before the formation of the polyimide 705 in Example 1. Accordingly, the arrangement of the piezoelectric elements in the Z-axis direction with respect to the beam portions and the spring material in Example 1 was opposite to that in FIGS. 1 and 2A.

In Example 1 above, the beam portions and the spring material were made of polyimide. However, the present invention is not limited thereto. When the beam portions and the spring material are made of a resin material with a small Young's modulus such as polyimide and SU8, it is possible to reduce the resonant frequency of a power generating mechanism to be obtained.

Embodiment 2

Figure 8:
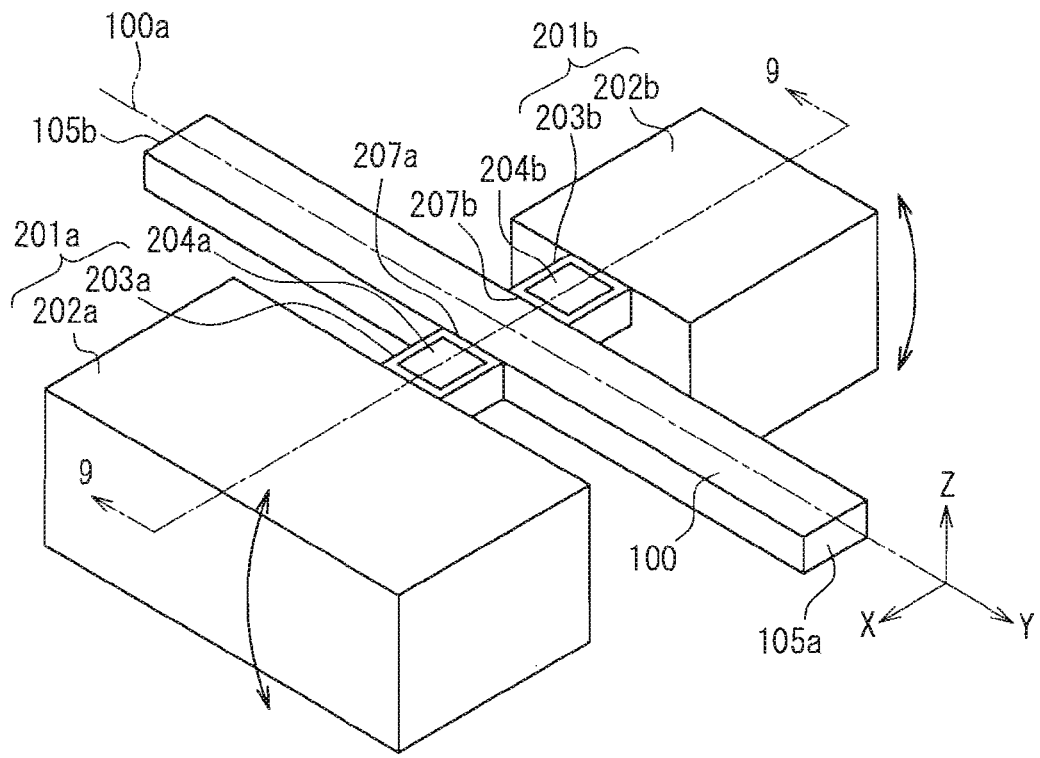
FIG. 8 is a perspective view showing a schematic configuration of a piezoelectric power generating mechanism according to Embodiment 2 of the present invention.
Figure 9:
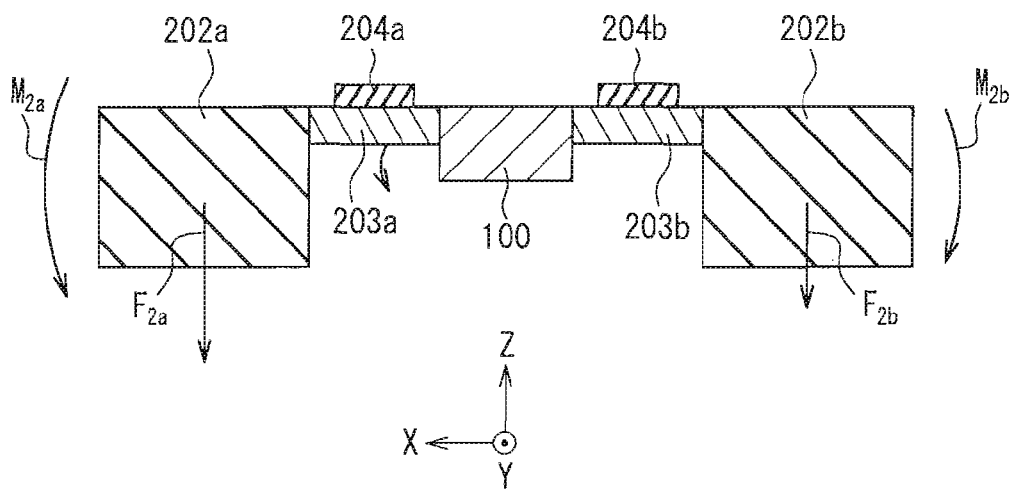
FIG. 9 is a cross-sectional view of the piezoelectric power generating mechanism according to Embodiment 2 of the present invention as shown in FIG. 8, showing a cross section cut along alternate long and short dashed lines 9-9 and seen from an arrow direction.

FIG. 8 is a perspective view showing a schematic configuration of a piezoelectric power generating mechanism according to Embodiment 2 of the present invention. FIG. 9 is a cross-sectional view of the piezoelectric power generating mechanism according to Embodiment 2, showing a cross section cut along alternate long and short dashed lines 9-9 in FIG. 8 and seen from an arrow direction.

The piezoelectric power generating mechanism of Embodiment 2 is characterized in that a plurality of oscillators around a spring material have different moments of inertia by allowing the oscillators to have different masses. The piezoelectric power generating mechanism includes a spring material 100, two oscillators 201a and 201b attached to the spring material 100, and piezoelectric elements 204a and 204b for converting vibration energy into electric energy. Both ends 105a and 105b of the spring material 100 are fixed. For convenience of explanation, as shown in the figure, an XYZ rectangular coordinate system is set, in which an axis parallel to a major axis of the spring material 100, i.e., an axis 100a connecting the both ends 105a and 105b of the spring material 100, is a Y-axis, an axis parallel to a plane including the Y-axis and the two oscillators 201a and 201b and orthogonal to the Y-axis is an X-axis, and an axis orthogonal to the Y-axis and the X-axis is a Z-axis.

The oscillators 201a and 201b respectively include mass portions 202a and 202b, and beam portions 203a and 203b having spring characteristics. One end of each of the beam portions 203a and 203b is connected to the spring material 100, and the other end thereof is connected to each of the mass portions 202a and 202b. The oscillator 201a and the oscillator 201b are located at the same positions in the Z-axis direction. The piezoelectric elements 204a and 204b are attached to the beam portions 203a and 203b, respectively.

A position 207a at which the oscillator 201a is attached to the spring material 100 and a position 207b at which the oscillator 201b is attached to the spring material 100 are the same in the axis 100a direction (Y-axis direction). The beam portion 203a and the beam portion 203b are identical in specifications, and the piezoelectric element 204a and the piezoelectric element 204b are identical in specifications. However, the mass portion 202a has a larger mass than that of the mass portion 202b. In other words, the oscillator 201a and the oscillator 201b are arranged on both sides with respect to a YZ plane, and are asymmetric with respect to the YZ plane.

The piezoelectric power generating mechanism of Embodiment 2 is placed so that the direction of acceleration caused when a structure is vibrated, a human is walking, or the like coincides with the Z-axis direction. When acceleration in the positive direction of the Z-axis acts on the piezoelectric power generating mechanism, the mass portions 202a and 202b are subjected to inertial forces $F_{2a}$ and $F_{2b}$, respectively, in the negative direction of the Z-axis as shown in FIG. 9. Since the mass portion 202a has a larger mass than that of the mass portion 202b, the inertial force $F_{2a}$ is larger than the inertial force $F_{2b}$. Accordingly, a rotation moment $M_{2a}$ exerted on the spring material 100 by the oscillator 201a becomes larger than a rotation moment $M_{2b}$ exerted on the spring material 100 by the oscillator 201b. The difference between the rotation moments $M_{2a}$ and $M_{2b}$ leads to the generation of a rotation torque. As a result, the spring material 100 is twisted between the attachment positions 207a and 207b and the end 105b and between the attachment positions 207a and 207b and the end 105a, and a restoring force thereof causes vibrations. Energy of the vibrations is converted into electric energy by the piezoelectric elements 204a and 204b. The power generating mechanism of Embodiment 2 is based on the above-described principle of power generation.

The power generating mechanism of the present embodiment can convert vibration energy into electric energy most efficiently when the oscillation frequency of vibrations applied externally and the resonant frequency of torsional vibrations of the power generating mechanism coincide with each other, allowing the power generating mechanism to resonate. When external vibrations with an angular velocity ω act on the power generating mechanism, the inertial forces $F_{2a}$ and $F_{2b}$ to which the mass portions 202a and 202b are subjected increase or decrease periodically at the angular velocity ω. Accordingly, the rotation torque generated due to the difference between the rotation moment $M_{2a}$ and the rotation moment $M_{2b}$ also increases or decreases periodically at the angular velocity ω. Torsional vibrations generated by the rotation torque have an amplitude $\theta_1$ expressed by Formula (3), where G is the torsional rigidity of the spring material 100.

[Formula 3]

$$\theta_1 = \frac{M_{2a} - M_{2b}}{G} \qquad (3)$$

The power generating mechanism can generate a maximum electric power $E_{max}$ expressed by Formula (4), where $\theta_2$ is the amplitude of torsional vibrations at the time of resonance by the rotation torque.

[Formula 4]

$$E_{max} = \frac{c_e \theta_2^2 \omega^2}{2} \qquad (4)$$

In the formula, $c_e$ is a coefficient representing vibration damping caused when energy is released from the system due to power generation, and ω is an angular velocity of the torsional vibrations. The angular velocity ω, which is set to be equal to the angular velocity of the vibrations applied externally, is expressed by Formula (5) based on the torsional rigidity G of the spring material 100 and a moment of inertia $I_{zz}$ with respect to the spring material 100 as an axis.

[Formula 5]

$$\omega = \sqrt{\frac{G}{I_{ZZ}}} \qquad (5)$$

Further, the amplitude $\theta_1$ due to the external vibrations and the amplitude $\theta_2$ at the time of resonance satisfy a relationship expressed by Formula (6).

[Formula 6]

$$c_e + c_m = \frac{I_{zz}\theta_1 \omega}{\theta_2} \quad (6)$$

In the formula, ω is an angular velocity corresponding to the torsional vibrations at the resonant frequency, $c_e$ is a coefficient representing damping caused when energy is released from the system due to power generation as described above, and $c_m$ is s a coefficient representing vibration damping caused by material deformation, air resistance, and the like. In order to generate electricity most efficiently, it is ideal for the resistance other than damping caused by power generation to be extremely low, which corresponds to the case where a relationship expressed by Formula (7) is satisfied.

[Formula 7]

$$c_e = \frac{I_{zz}\theta_1 \omega}{\theta_2} \quad (7)$$

When Formula (7), Formula (5), and Formula (3) are substituted into Formula (4), the maximum electric power $E_{max}$ to be generated at the time of resonance due to the external vibrations is expressed by Formula (8).

[Formula 8]

$$E_{max} = \frac{(M_{2a} - M_{2b})^2}{2c_e} \quad (8)$$

As described above, electricity proportional to the square of the difference between the rotation moment $M_{2a}$ and the rotation moment $M_{2b}$ is expected to be generated.

Assuming that $M_{2b}=sM_{2a}$ (0<s<1) is satisfied, the ratio s represents the degree of asymmetry (i.e., structural nonuniformity) of the oscillators 201a and 201b with respect to the spring material 100. The lower the ratio s, the larger the difference between the rotation moment $M_{2a}$ and the rotation moment $M_{2b}$, and the higher the degree of asymmetry with respect to the spring material 100, making the structure nonuniform. Formula (8) can be rewritten as Formula (9) below.

[Formula 9]

$$E_{max} = \frac{\{M_{2a}(1-s)\}^2}{2c_e} \quad (9)$$

Figure 10:
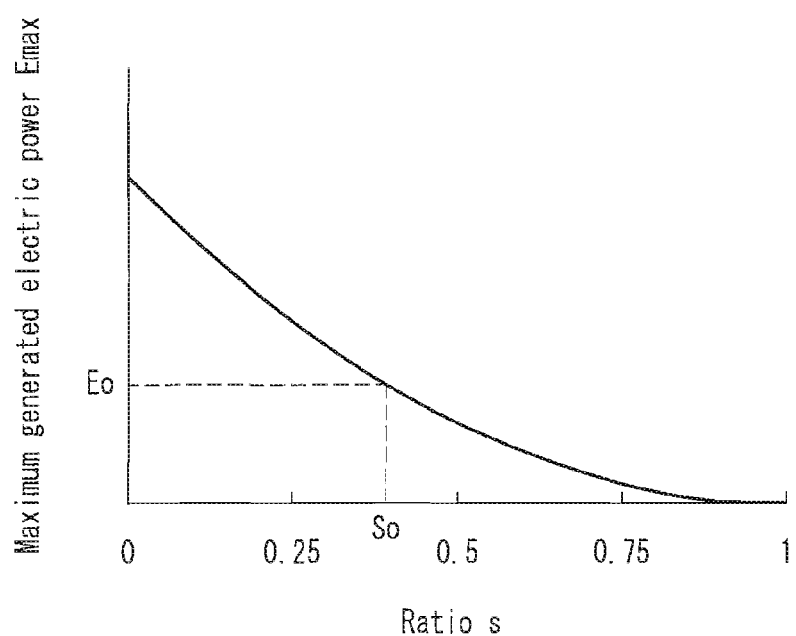
FIG. 10 is a diagram showing the relationship between maximum generated electric power $E_{max}$ and a rotation moment ratio s in the piezoelectric power generating mechanism according to Embodiment 2 of the present invention.

The relationship between the maximum generated electric power $E_{max}$ and the ratio s is shown in FIG. 10. It can be seen that, in order to achieve a larger amount of power generation, it is necessary to make the ratio s lower, i.e., increase asymmetry with respect to the spring material 100. During the design of the power generating mechanism, it is possible to obtain an upper limit so of the ratio s required by a necessary amount $E_0$ of power generation with reference to FIG. 10, thereby determining the degree of asymmetry of the oscillators with respect to the spring material 100. However, since Formula (9) is satisfied in the ideal case, the maximum generated electric power actually is smaller than that in FIG. 10. For example, in order to obtain the necessary amount $E_0$ of power generation, the ratio s of the power generating mechanism actually has to be lower than the upper limit so of the ratio s obtained from FIG. 10.

In the present embodiment, since the both ends 105a and 105b of the spring material 100 are fixed, the masses of the oscillators 201a and 201b are held by a tension exerted on the spring material 100. Thus, the mass portions 202a and 202b are displaced by a small amount when the spring material 100 is bent due to gravity and acceleration. Meanwhile, when the torsional rigidity of the spring material 100 is set to be low, the resonant frequency of torsional vibrations can be reduced significantly. Therefore, it is possible to realize a downsized piezoelectric power generating mechanism with a low resonant frequency.

In FIGS. 8 and 9, the beam portions 203a and 203b have a rectangular parallelepiped shape. However, the shape of the beam portions 203a and 203b is not limited thereto as long as they can hold the mass portions 202a and 202b.

In FIGS. 8 and 9, the spring material 100 is a plate-like member whose cross section taken in a direction vertical to the axis 100a is a certain rectangle. However, the shape of the spring material 100 is not limited particularly, and the same effect as described above can be achieved as long as the masses of the oscillators 201a and 201b can be held by a tension exerted on the spring material 100 with a small bending amount in a state where it is held at the both ends 105a and 105b, and the torsional rigidity of the spring material 100 itself is low.

In the present embodiment, the attachment positions of the piezoelectric elements are not limited to those shown in FIGS. 8 and 9. For example, the piezoelectric element may be attached in a region between the attachment positions 207a and 207b and the end 105b and/or a region between the attachment positions 207a and 207b and the end 105a of the spring material 100, instead of or in addition to being attached to the beam portions 203a and 203b. The piezoelectric element attached in any of these regions also can be distorted due to a twist of the spring material 100, making it possible to obtain electric power.

Further, the piezoelectric elements may be attached to both sides of the spring material 100 and/or the beam portions 203a and 203b so as to form a bimorph structure, instead of being attached to only one side of the beam portions 203a and 203b as shown in FIGS. 8 and 9.

Furthermore, when a plurality of the piezoelectric elements are attached at different positions in consideration of deformation of the members due to vibrations, and are connected so that electric power generated by the respective piezoelectric elements is not cancelled each other, a larger amount of electric power can be obtained.

In FIGS. 8 and 9, the two oscillators 201a and 201b arranged on both sides of the spring material 100 have different masses, thereby generating torsional vibrations of the spring material 100. However, the present invention is not limited thereto. For example, the oscillator may be arranged on only one side of the spring material 100. Such a configuration is equivalent to the case where one of the two mass portions 202a and 202b of the power generating mechanism shown in FIGS. 8 and 9 has an extremely small mass, which also leads to the generation of torsional vibrations as in Embodiment 2.

Example 2

The piezoelectric power generating mechanism of Embodiment 2 was produced with the use of thin film formation by sputtering and photolithography as in Example 1.

The piezoelectric power generating mechanism produced included a spring material made of polyimide with a length (dimension in the Y-axis direction) of 3000 μm, a width (dimension in the X-axis direction) of 100 μm, and a thickness (dimension in the Z-axis direction) of 10 μm, a first mass portion made of a silicon substrate with a height (dimension in the Y-axis direction) of 2000 μm, a width (dimension in the X-axis direction) of 1500 μm, and a thickness (dimension in the Z-axis direction) of 400 μm, a second mass portion made of a silicon substrate with a height (dimension in the Y-axis direction) of 500 μm, a width (dimension in the X-axis direction) of 1500 μm, and a thickness (dimension in the Z-axis direction) of 400 μm, a pair of beam portions for supporting the first and second mass portions, each made of polyimide with a length (dimension in the X-axis direction) of 100 μm, a width (dimension in the Y-axis direction) of 200 μm, and a thickness (dimension in the Z-axis direction) of 10 μm, and piezoelectric elements attached to the pair of beam portions, each having a thickness (dimension in the Z-axis direction) of 3 μm.

The power generation characteristics of this piezoelectric power generating mechanism were predicted by using a finite element method. A primary resonant frequency was 10.6 Hz, and kinetic energy of the mass portions at the time of resonance was 6.4 μJ/s. Assuming that the efficiency of converting kinetic energy into electric energy was 10%, it was found that this power generating mechanism was expected to generate electricity of 0.6 μW.

Embodiment 3

Figure 11:
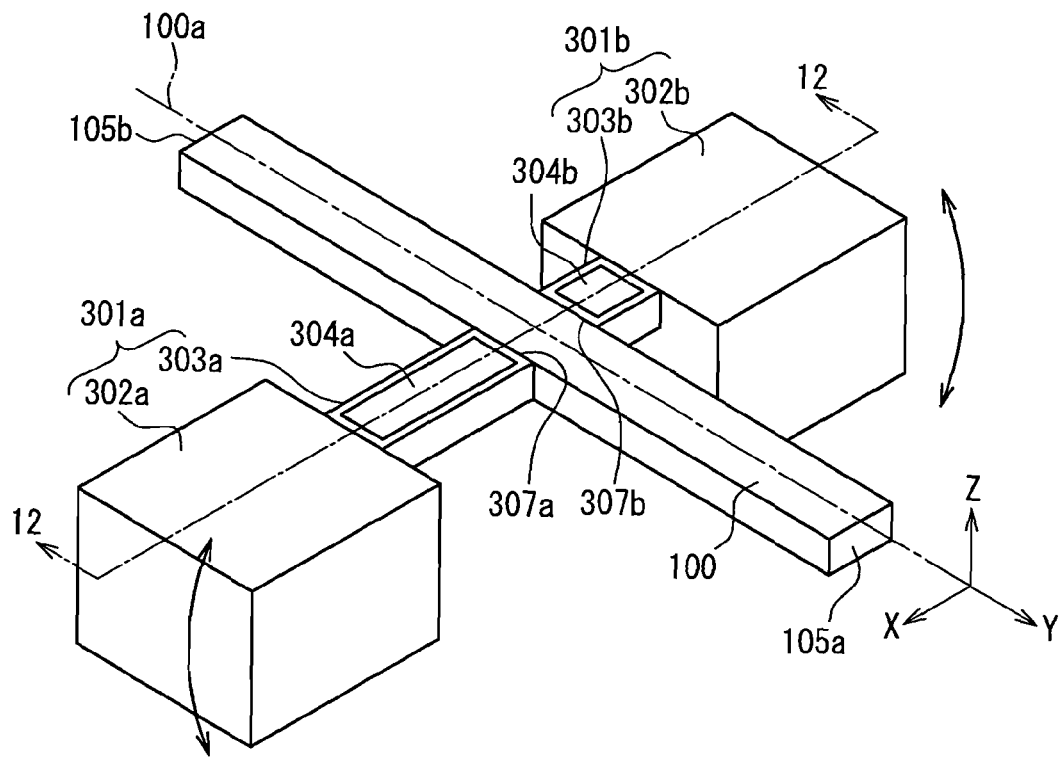
FIG. 11 is a perspective view showing a schematic configuration of a piezoelectric power generating mechanism according to Embodiment 3 of the present invention.
Figure 12:
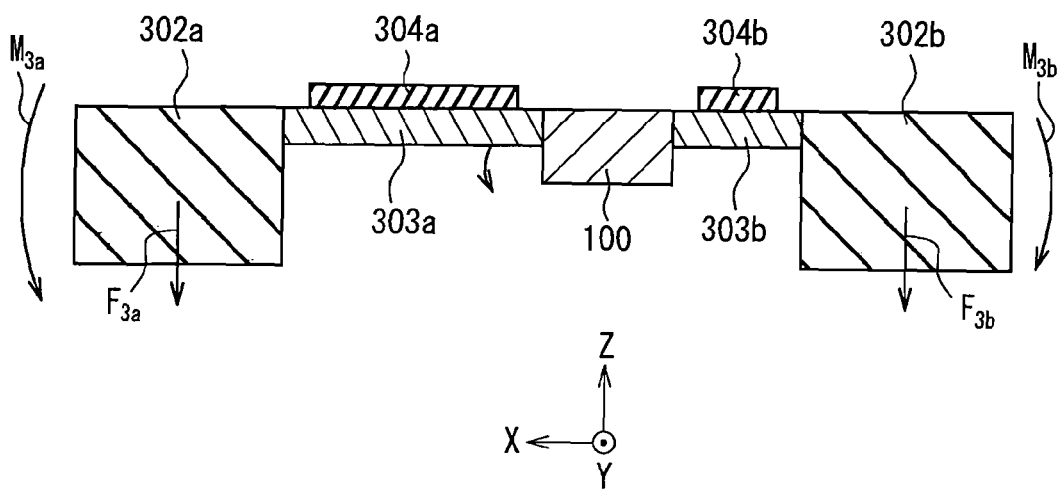
FIG. 12 is a cross-sectional view of the piezoelectric power generating mechanism according to Embodiment 3 of the present invention as shown in FIG. 11, showing a cross section cut along alternate long and short dashed lines 12-12 and seen from an arrow direction.

FIG. 11 is a perspective view showing a schematic configuration of a piezoelectric power generating mechanism according to Embodiment 3 of the present invention. FIG. 12 is a cross-sectional view of the piezoelectric power generating mechanism according to Embodiment 3, showing a cross section cut along alternate long and short dashed lines 12-12 in FIG. 11 and seen from an arrow direction.

The piezoelectric power generating mechanism of Embodiment 3 is characterized in that a plurality of oscillators around a spring material have different moments of inertia by allowing beam portions for holding masses to have different lengths. The piezoelectric power generating mechanism includes a spring material 100, two oscillators 301a and 301b attached to the spring material 100, and piezoelectric elements 304a and 304b for converting vibration energy into electric energy. Both ends 105a and 105b of the spring material 100 are fixed. For convenience of explanation, as shown in the figure, an XYZ rectangular coordinate system is set, in which an axis parallel to a major axis of the spring material 100, i.e., an axis 100a connecting the both ends 105a and 105b of the spring material 100, is a Y-axis, an axis parallel to a plane including the Y-axis and the two oscillators 301a and 301b and orthogonal to the Y-axis is an X-axis, and an axis orthogonal to the Y-axis and the X-axis is a Z-axis.

The oscillators 301a and 301b respectively include mass portions 302a and 302b, and beam portions 303a and 303b having spring characteristics. One end of each of the beam portions 303a and 303b is connected to the spring material 100, and the other end thereof is connected to each of the mass portions 302a and 302b. The oscillator 301a and the oscillator 301b are located at the same positions in the Z-axis direction. The piezoelectric elements 304a and 304b are attached to the beam portions 303a and 303b, respectively.

A position 307a at which the oscillator 301a is attached to the spring material 100 and a position 307b at which the oscillator 301b is attached to the spring material 100 are the same in the axis 100a direction (Y-axis direction). The mass portion 302a and the mass portion 302b have the same mass, and the piezoelectric element 304a and the piezoelectric element 304b are identical in specifications. However, the beam portion 303a has a length (dimension in the X-axis direction) longer than that of the beam portion 303b. In other words, the oscillator 301a and the oscillator 301b are arranged on both sides with respect to a YZ plane, and are asymmetric with respect to the YZ plane.

The piezoelectric power generating mechanism of Embodiment 3 is placed so that the direction of acceleration caused when a structure is vibrated, a human is walking, or the like coincides with the Z-axis direction. When acceleration in the positive direction of the Z-axis acts on the piezoelectric power generating mechanism, the mass portions 302a and 302b are subjected to inertial forces $F_{3a}$ and $F_{3b}$, respectively, in the negative direction of the Z-axis as shown in FIG. 12. Since the mass portion 302a and the mass portion 302b have the same mass, the inertial force $F_{3a}$ and the inertial force $F_{3b}$ are equal. However, since the beam portion 303a is longer than the beam portion 303b, the distances from the axis 100a to the respective points of action of the inertial forces $F_{3a}$ and $F_{3b}$ are different. Accordingly, a rotation moment $M_{3a}$ exerted on the spring material 100 by the oscillator 301a becomes larger than a rotation moment $M_{3b}$ exerted on the spring material 100 by the oscillator 301b. The difference between the rotation moments $M_{3a}$ and $M_{3b}$ leads to the generation of a rotation torque. As a result, the spring material 100 is twisted between the attachment positions 307a and 307b and the end 105b and between the attachment positions 307a and 307b and the end 105a, and a restoring force thereof causes vibrations. Energy of the vibrations is converted into electric energy by the piezoelectric elements 304a and 304b. The power generating mechanism of Embodiment 3 is based on the above-described principle of power generation.

Also in the power generating mechanism of the present embodiment, since the relationship of Formula (9) is satisfied as in Embodiment 2, it is possible to obtain a ratio s required by a necessary amount of power generation, thereby determining the degree of asymmetry of the oscillators with respect to the spring material 100.

In the present embodiment, since the both ends 105a and 105b of the spring material 100 are fixed, the masses of the oscillators 301a and 301b are held by a tension exerted on the spring material 100. Thus, the mass portions 302a and 302b are displaced by a small amount when the spring material 100 is bent due to gravity and acceleration. Meanwhile, when the torsional rigidity of the spring material 100 is set to be low, the resonant frequency of torsional vibrations can be reduced significantly. Therefore, it is possible to realize a downsized piezoelectric power generating mechanism with a low resonant frequency.

In FIGS. 11 and 12, the beam portions 303a and 303b have a rectangular parallelepiped shape. However, the shape of the beam portions 303a and 303b is not limited thereto as long as they can hold the mass portions 302a and 302b.

In FIGS. 11 and 12, the spring material 100 is a plate-like member whose cross section taken in a direction vertical to the axis 100a is a certain rectangle. However, the shape of the spring material 100 is not limited particularly, and the same effect as described above can be achieved as long as the masses of the oscillators 301a and 301b can be held by a tension exerted on the spring material 100 with a small bending amount in a state where it is held at the both ends 105a and 105b, and the torsional rigidity of the spring material 100 itself is low.

In the present embodiment, the attachment positions of the piezoelectric elements are not limited to those shown in FIGS. 11 and 12. For example, the piezoelectric element may be attached in a region between the attachment positions 307a and 307b and the end 105b and/or a region between the attachment positions 307a and 307b and the end 105a of the spring material 100, instead of or in addition to being attached to the beam portions 303a and 303b. The piezoelectric element attached in any of these regions also can be distorted due to a twist of the spring material 100, making it possible to obtain electric power.

Further, the piezoelectric elements may be attached to both sides of the spring material 100 and/or the beam portions 303a and 303b so as to form a bimorph structure, instead of being attached to only one side of the beam portions 303a and 303b as shown in FIGS. 11 and 12.

Furthermore, when a plurality of the piezoelectric elements are attached at different positions in consideration of deformation of the members due to vibrations, and are connected so that the electric power generated by the respective piezoelectric elements does not cancel each other, a larger amount of electric power can be obtained.

Example 3

The piezoelectric power generating mechanism of Embodiment 3 was produced with the use of thin film formation by sputtering and photolithography as in Example 1.

The piezoelectric power generating mechanism produced included a spring material made of polyimide with a length (dimension in the Y-axis direction) of 3000 µm, a width (dimension in the X-axis direction) of 100 µm, and a thickness (dimension in the Z-axis direction) of 10 µm, a pair of mass portions, each made of a silicon substrate with a height (dimension in the Y-axis direction) of 1000 µm, a width (dimension in the X-axis direction) of 1500 µm, and a thickness (dimension in the Z-axis direction) of 400 µm, a first beam portion made of polyimide with a length (dimension in the X-axis direction) of 100 µm, a width (dimension in the Y-axis direction) of 100 µm, and a thickness (dimension in the Z-axis direction) of 10 µm for supporting one of the mass portions, a second beam portion made of polyimide with a length (dimension in the X-axis direction) of 800 µm, a width (dimension in the Y-axis direction) of 100 µm, and a thickness (dimension in the Z-axis direction) of 10 µm for supporting the other mass portion, and piezoelectric elements attached to the first and second beam portions, each having a thickness (dimension in the Z-axis direction) of 3 µm.

The power generation characteristics of this piezoelectric power generating mechanism were predicted by using a finite element method. A primary resonant frequency was 6.2 Hz, and kinetic energy of the mass portions at the time of resonance was 0.96 µJ/s. Assuming that the efficiency of converting kinetic energy into electric energy was 10%, it was found that this power generating mechanism was expected to generate electricity of 0.1 µW.

Embodiment 4

Figure 13:
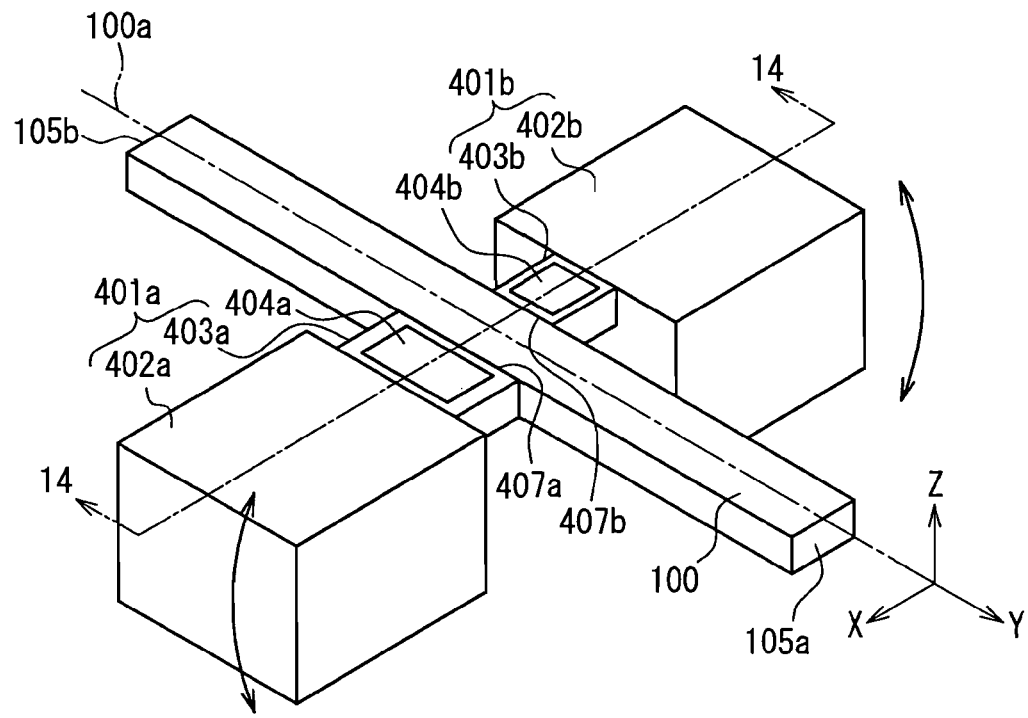
FIG. 13 is a perspective view showing a schematic configuration of a piezoelectric power generating mechanism according to Embodiment 4 of the present invention.
Figure 14:
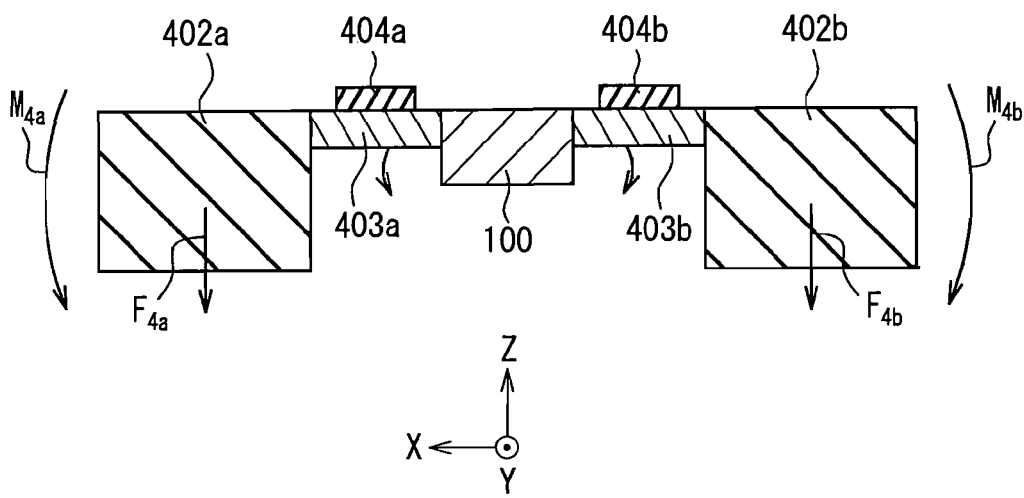
FIG. 14 is a cross-sectional view of the piezoelectric power generating mechanism according to Embodiment 4 of the present invention as shown in FIG. 13, showing a cross section cut along alternate long and short dashed lines 14-14 and seen from an arrow direction.
Figure 15A:
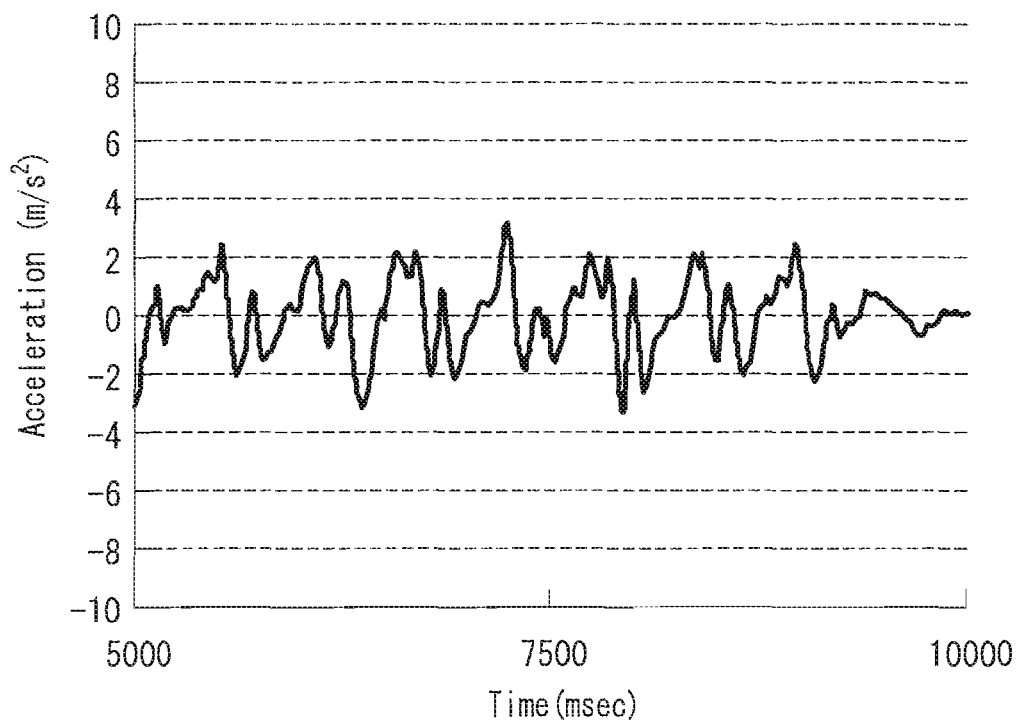
FIG. 15A is a graph showing a change with time in acceleration caused when a human is walking.
Figure 15B:
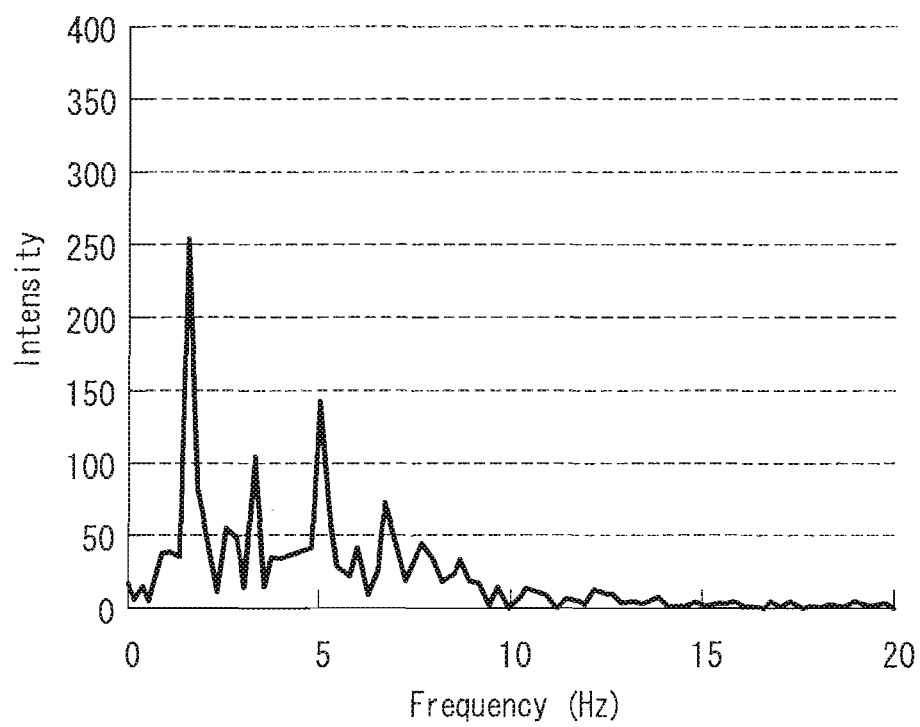
FIG. 15B is a graph showing frequency components of acceleration caused when a human is walking.
Figure 16A:
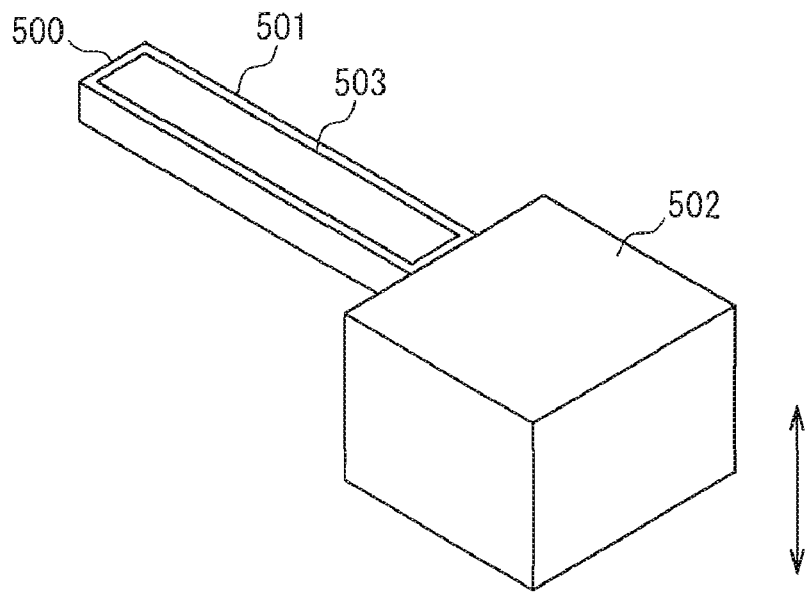
FIG. 16A is a conceptual diagram of a conventional cantilevered piezoelectric power generating mechanism using bending of a beam.
Figure 16B:
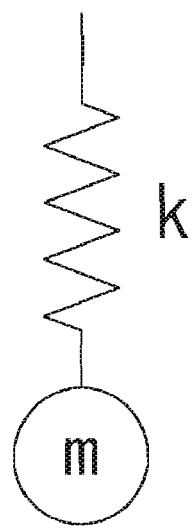
FIG. 16B is a model diagram of the piezoelectric power generating mechanism in FIG. 16A.

FIG. 13 is a perspective view showing a schematic configuration of a piezoelectric power generating mechanism according to Embodiment 4 of the present invention. FIG. 14 is a cross-sectional view of the piezoelectric power generating mechanism according to Embodiment 4, showing a cross section cut along alternate long and short dashed lines 14-14 in FIG. 13 and seen from an arrow direction.

The piezoelectric power generating mechanism of Embodiment 4 is characterized in that a plurality of oscillators have different resonant frequencies by allowing beam portions for holding masses to have different widths. The piezoelectric power generating mechanism includes a spring material 100, two oscillators 401a and 401b attached to the spring material 100, and piezoelectric elements 404a and 404b for converting vibration energy into electric energy. Both ends 105a and 105b of the spring material 100 are fixed. For convenience of explanation, as shown in the figure, an XYZ rectangular coordinate system is set, in which an axis parallel to a major axis of the spring material 100, i.e., an axis 100a connecting the both ends 105a and 105b of the spring material 100, is a Y-axis, an axis parallel to a plane including the Y-axis and the two oscillators 401a and 401b and orthogonal to the Y-axis is an X-axis, and an axis orthogonal to the Y-axis and the X-axis is a Z-axis.

The oscillators 401a and 401b respectively include mass portions 402a and 402b, and beam portions 403a and 403b having spring characteristics. One end of each of the beam portions 403a and 403b is connected to the spring material 100, and the other end thereof is connected to each of the mass portions 402a and 402b. The oscillator 401a and the oscillator 401b are located at the same positions in the Z-axis direction. The piezoelectric elements 404a and 404b are attached to the beam portions 403a and 403b, respectively.

A position 407a at which the oscillator 401a is attached to the spring material 100 and a position 407b at which the oscillator 401b is attached to the spring material 100 are the same in the axis 100a direction (Y-axis direction). The mass portion 402a and the mass portion 402b have the same mass, and the piezoelectric element 404a and the piezoelectric element 404b are identical in specifications. The beam portion 403a and the beam portion 403b have the same length (dimension in the X-axis direction). However, the beam portion 403a has a width (dimension in the Y-axis direction) larger than that of the beam portion 403b. In other words, the oscillator 401a and the oscillator 401b are arranged on both sides with respect to a YZ plane, and are asymmetric with respect to the YZ plane.

The piezoelectric power generating mechanism of Embodiment 4 is placed so that the direction of acceleration caused when a structure is vibrated, a human is walking, or the like coincides with the Z-axis direction. When acceleration in the positive direction of the Z-axis acts on the piezoelectric power generating mechanism, the mass portions 402a and 402b are subjected to inertial forces $F_{4a}$ and $F_{4b}$, respectively, in the negative direction of the Z-axis as shown in FIG. 14. Since the mass portion 402a and the mass portion 402b have the same mass, the inertial force $F_{4a}$ and the inertial force $F_{4b}$ are equal. Further, since the beam portion 403a and the beam portion 403b have the same length, a static rotation moment $M_{4a}$ exerted on the spring material 100 by the oscillator 401a and a static rotation moment $M_{4b}$ exerted on the spring material 100 by the oscillator 401b are equal.

However, since the beam portion 403a and the beam portion 403b have different widths, they have different flexural rigidity in a bending direction. Accordingly, the resonant frequency of the oscillator 401a with respect to the attachment position 407a is different from the resonant frequency of the oscillator 401b with respect to the attachment position 407b. As a result, when acceleration is applied, an oscillator with a resonant frequency close to the rate of change of the acceleration responds more quickly, and due to a rotation moment generated thereby, the spring material 100 is twisted between the attachment positions 407a and 407b and the end 105b and between the attachment positions 407a and 407b and the end 105a, and a restoring force thereof causes vibrations. Energy of the vibrations is converted into electric energy by the piezoelectric elements 404a and 404b. The power generating mechanism of Embodiment 4 is based on the above-described principle of power generation.

In the present embodiment, since the both ends 105a and 105b of the spring material 100 are fixed, the masses of the oscillators 401a and 401b are held by a tension exerted on the spring material 100. Thus, the mass portions 402a and 402b are displaced by a small amount when the spring material 100 is bent due to gravity and acceleration. Meanwhile, when the torsional rigidity of the spring material 100 is set to be low, the resonant frequency of torsional vibrations can be reduced significantly. Therefore, it is possible to realize a downsized piezoelectric power generating mechanism with a low resonant frequency.

In FIGS. 13 and 14, the beam portions 403a and the beam portion 403b have different widths. However, the present invention is not limited thereto. For example, the beam portion 403a and the beam portion 403b may have different thicknesses (dimensions in the Z-axis direction) so as to have different flexural rigidity, which also allows the oscillator 401a and the oscillator 401b to have different resonant frequencies, resulting in the same effect as described above.

In FIGS. 13 and 14, the beam portions 403a and 403b have a rectangular parallelepiped shape. However, the shape of the beam portions 403a and 403b is not limited thereto as long as they can hold the mass portions 402a and 402b and have different flexural rigidity.

In FIGS. 13 and 14, the spring material 100 is a plate-like member whose cross section taken in a direction vertical to the axis 100a is a certain rectangle. However, the shape of the spring material 100 is not limited particularly, and the same effect as described above can be achieved as long as the masses of the oscillators 401a and 401b can be held by a tension exerted on the spring material 100 with a small bending amount in a state where it is held at the both ends 105a and 105b, and the torsional rigidity of the spring material 100 itself is low.

In the present embodiment, the attachment positions of the piezoelectric elements are not limited to those shown in FIGS. 13 and 14. For example, the piezoelectric element may be attached in a region between the attachment positions 407a and 407b and the end 105b and/or a region between the attachment positions 407a and 407b and the end 105a of the spring material 100, instead of or in addition to being attached to the beam portions 403a and 403b. The piezoelectric element attached in any of these regions also can be distorted due to a twist of the spring material 100, making it possible to obtain electric power.

Further, the piezoelectric elements may be attached to both sides of the spring material 100 and/or the beam portions 403a and 403b so as to form a bimorph structure, instead of being attached to only one side of the beam portions 403a and 403b as shown in FIGS. 13 and 14.

Furthermore, when a plurality of the piezoelectric elements are attached at different positions in consideration of deformation of the members due to vibrations, and are connected so that electric power generated by the respective piezoelectric elements is not cancelled each other, a larger amount of electric power can be obtained.

Example 4

The piezoelectric power generating mechanism of Embodiment 4 was produced with the use of thin film formation by sputtering and photolithography as in Example 1.

The piezoelectric power generating mechanism produced included a spring material made of polyimide with a length (dimension in the Y-axis direction) of 3000 μm, a width (dimension in the X-axis direction) of 100 μm, and a thickness (dimension in the Z-axis direction) of 5 μm, a pair of mass portions, each made of a silicon substrate with a height (dimension in the Y-axis direction) of 1000 μm, a width (dimension in the X-axis direction) of 1500 μm, and a thickness (dimension in the Z-axis direction) of 400 μm, a first beam portion made of polyimide with a length (dimension in the X-axis direction) of 450 μm, a width (dimension in the Y-axis direction) of 100 μm, and a thickness (dimension in the Z-axis direction) of 5 μm for supporting one of the mass portions, a second beam portion made of polyimide with a length (dimension in the X-axis direction) of 450 μm, a width (dimension in the Y-axis direction) of 300 μm, and a thickness (dimension in the Z-axis direction) of 5 μm for supporting the other mass portion, and piezoelectric elements attached to the first and second beam portions, each having a thickness (dimension in the Z-axis direction) of 3 μm.

The power generation characteristics of this piezoelectric power generating mechanism were predicted by using a finite element method. A primary resonant frequency was 7.0 Hz, and kinetic energy of the mass portions at the time of resonance was 1.2 μJ/s. Assuming that the efficiency of converting kinetic energy into electric energy was 10%, it was found that electricity of 0.1 μW was expected to be generated.

Embodiments 1 to 4 are only illustrative, and the present invention is not limited thereto. For example, two or more of Embodiments 1 to 4 above may be combined. Further, the number of the oscillators is not limited to two, and one or three or more oscillators also may be provided. The present invention is not limited particularly as long as the both ends of the spring material are fixed, and the oscillators are attached to the spring material asymmetrically with respect to the YZ plane including the axis connecting the both ends, whereby torsional vibrations can act on the spring material. When the material of the spring material and the like are set appropriately so as to achieve low torsional rigidity of the spring material, it is possible to realize a downsized piezoelectric power generating mechanism that causes vibrations at a low resonant frequency in a small vibration space.

Any of the embodiments described above strictly is intended to clarify the technical contents of the present invention. The present invention should not be interpreted as being limited to such specific examples, and can be carried out by being variously modified within the scope of the spirit of the present invention and the claims and should be interpreted broadly.

INDUSTRIAL APPLICABILITY

The present invention is applicable to any fields without any particular limitation. Since the present invention is small in size and has a low resonant frequency, when it is used as a charging electric generator or an auxiliary power source for a mobile device such as a cellular phone and a sound reproducer, it can generate electricity only by being carried by a human while he/she is traveling, making it possible to eliminate the need for charges or to extend the time between charges.

Further, when the present invention is used to generate electricity by vibrations of a construction such as various structures and a movable body like an automobile input thereto, a plurality of sensors installed in the construction are connected in a network form. In this manner, the present invention can be used as a power source for a small sensor for use in a sensor network to be operated as a system.

The invention claimed is:

1. A piezoelectric power generating mechanism comprising:
   a spring material whose both ends are held;
   at least one oscillator attached to the spring material; and
   a piezoelectric element attached to the spring material or the at least one oscillator;
   wherein assuming that an axis parallel to an axis connecting the both ends of the spring material is a Y-axis, an axis parallel to a plane including the Y-axis and the at least one oscillator and orthogonal to the Y-axis is an X-axis, and an axis orthogonal to the Y-axis and the X-axis is a Z-axis, the at least one oscillator is asymmetric with respect to a plane including the Y-axis and the Z-axis.

2. The piezoelectric power generating mechanism according to claim 1,
   wherein a plurality of the oscillators are provided, and
   the plurality of the oscillators are attached to the spring material at different positions in a Y-axis direction.

3. The piezoelectric power generating mechanism according to claim 1,
   wherein the oscillator includes a mass portion and a beam portion having spring characteristics, and
   one end of the beam portion is connected to the spring material, and the other end thereof is connected to the mass portion.

4. The piezoelectric power generating mechanism according to claim 3,
   wherein a plurality of the oscillators are provided, and
   the mass portions of the plurality of the oscillators have masses different from each other.

5. The piezoelectric power generating mechanism according to claim 3,
   wherein a plurality of the oscillators are provided, and
   the beam portions of the plurality of the oscillators have shapes different from each other.

6. The piezoelectric power generating mechanism according to claim 3, wherein the piezoelectric element is attached to the beam portion.

7. The piezoelectric power generating mechanism according to claim 1, wherein the piezoelectric element is attached to the spring material.

* * * * *